(12) United States Patent
Chevallier et al.

(10) Patent No.: US 6,304,504 B1
(45) Date of Patent: Oct. 16, 2001

(54) METHODS AND SYSTEMS FOR ALTERNATE BITLINE STRESS TESTING

(75) Inventors: Christophe J. Chevallier, Mountain View; Benjamin Louie, Sunnyvale, both of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,556

(22) Filed: Aug. 30, 2000

(51) Int. Cl.$^7$ .................................................. G11C 29/00
(52) U.S. Cl. ...................................... 365/201; 365/185.09
(58) Field of Search .............................. 365/201, 230.04, 365/185.09, 185.23

(56) References Cited

U.S. PATENT DOCUMENTS

| | | | |
|---|---|---|---|
| 5,400,344 * | 3/1995 | Mori | 365/201 |
| 5,502,678 | 3/1996 | McClure | 365/201 |
| 5,610,866 | 3/1997 | McClure | 365/201 |
| 5,629,943 | 5/1997 | McClure | 371/21.1 |
| 5,657,284 | 8/1997 | Beffa | 365/201 |
| 5,745,420 | 4/1998 | McClure | 365/201 |
| 5,862,077 | 1/1999 | Briner | 365/185.21 |
| 5,898,629 | 4/1999 | Beffa et al. | 365/201 |
| 6,021,459 | 2/2000 | Norman et al. | 711/5 |
| 6,101,150 | 8/2000 | Roohparvar | 365/230.06 |

* cited by examiner

Primary Examiner—Tan T. Nguyen
(74) Attorney, Agent, or Firm—Fogg, Slifer & Polglaze, P.A.; Thomas W. Leffert

(57) ABSTRACT

Memory devices having architectures permitting the application of a voltage differential across alternate bitlines facilitate identifying and locating shorts within the memory device with particular reference to flash memory devices. The memory devices include a first plurality of selective coupling devices coupled between a first plurality of bitlines and a first variable potential node. The memory devices further include a second plurality of selective coupling devices coupled between a second plurality of bitlines and a second variable potential node. The first plurality of selective coupling devices are responsive to a first control signal to selectively provide electrical communication between the first plurality of bitlines and the first variable potential node. The second plurality of selective coupling devices are responsive to a second control signal to selectively provide electrical communication between the second plurality of bitlines and the second variable potential node. Each variable potential node provides two or more potential states. By applying the voltage differential across alternate bitlines, measuring the current leakage induced by the voltage differential, and comparing the current leakage to a predetermined threshold leakage value, shorts within the memory device are identified. Repetition of the procedure at various levels, such as the device level, block level, packet level or bitline level, can be used to not only identify the existence of a short, but to also locate the short with desired specificity.

21 Claims, 7 Drawing Sheets

METHODS AND SYSTEMS FOR ALTERNATE BITLINE STRESS TESTING

TECHNICAL FIELD OF THE INVENTION

The present invention relates generally to semiconductor memory devices, and in particular, the present invention relates to testing and stressing semiconductor memory devices for bitline-to-bitline shorts.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes semiconductor memory devices.

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bitline, or data line. An electrical signal is used to program a cell or cells. The electrical signal on the data line is controlled by a driver circuit. Accordingly, a semiconductor memory device may include several groups of cells, each coupled together with a bitline operated by a driver circuit.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment use flash memory cards as the medium to store data, send and receive wireless faxes, and store digital audio clips and digital images. Each of these applications requires large amounts of highly reliable memory.

Prior to shipping, a manufacturer may test its semiconductor memory devices as part of a quality program to improve end-use reliability. One of the tests performed includes a bitline stress test. Generally, the bitline stress test is used to stress the materials of which the memory cells are made. In the bitline stress test, a higher voltage than usual is applied to all of the cells in a group. During such a test, a voltage is applied across the memory cell terminals while the memory cell is in a non-conductive mode. A leakage current may indicate a short within the memory device. Using a voltage for the bitline stress test that is higher than operating voltages may also simulate extended aging on the memory device. Thus, the higher-than-normal voltage may identify or even induce a short that might not otherwise affect device performance until after extended field use of the memory device. This short may be highly resistive and not affect the operation of the memory device. It may, however, degrade the operation over time. While the global stress test described above may identify a short within a memory device, it is generally incapable of identifying bitline-to-bitline defects with particularity.

For the reasons stated above, and for other reasons stated below which will become apparent to those skilled in the art upon reading and understanding the present specification, there is a need in the art for alternate bitline stress test methods for semiconductor memory devices and circuitry to support such test methods.

SUMMARY OF THE INVENTION

The above-mentioned problems with memory devices and other problems are addressed by the present invention and will be understood by reading and studying the following specification.

Memory devices having architectures permitting the application of a voltage differential across alternate bitlines are described herein. Such memory device architectures facilitate identifying and locating shorts within the memory device. By applying the voltage differential across alternate bitlines, measuring the current leakage induced by the voltage differential, and comparing the current leakage to a predetermined threshold leakage value, shorts within the memory device are identified. Repetition of the procedure at various levels, such as the device level, block level, packet level or bitline level, can be used to not only identify the existence of a short, but to also locate the short with desired specificity.

For one embodiment, the invention provides a memory array. The memory array includes memory cells coupled to bitlines. The memory array further includes first selective coupling devices coupled between a first plurality of bitlines and a first variable potential node and second selective coupling devices coupled between a second plurality of bitlines and a second variable potential node. Each bitline of the first plurality of bitlines is adjacent at least one bitline of the second plurality of bitlines.

For another embodiment, the invention provides a memory array. The memory array includes memory cells coupled to bitlines. The memory array further includes first selective coupling devices coupled between a first plurality of bitlines and a first level shifter for selectively providing at least a first potential and a second potential to the first plurality of bitlines. The memory array still further includes second selective coupling devices coupled between a second plurality of bitlines and a second level shifter for selectively providing at least the first potential and the second potential to the second plurality of bitlines.

For yet another embodiment, the invention provides a memory array. The memory array includes memory cells coupled to bitlines and a bitline discharging circuit coupled to the bitlines. The bitline discharging circuit includes first selective coupling devices coupled between a first plurality of bitlines and a first variable potential node. The bitline discharging circuit further includes second selective coupling devices coupled between a second plurality of bitlines and a second variable potential node.

For a further embodiment, the invention provides a memory array. The memory array includes memory cells coupled to bitlines, wherein the bitlines include a first plurality of even bitlines and a second plurality of odd bitlines. The memory array further includes a first level shifter for providing one of at least two first potential states as a first bitline potential, a second level shifter for providing one of the at least two first potential states as a second bitline potential, a third level shifter for providing one of at least two second potential states as a first control signal, and a fourth level shifter for providing one of the at least two second potential states as a second control signal. The memory array still further includes first field-effect transistors each having a first source/drain region coupled to one of the first plurality of even bitlines, a second source/drain region coupled to the first level shifter for receiving the first bitline potential, and a gate coupled to the third level shifter for receiving the first control signal. The memory array still further includes second field-effect transistors each having a first source/drain region coupled to one of the second plurality of odd bitlines, a second source/drain region coupled to the second level shifter for receiving the second bitline potential, and a gate coupled to the fourth level shifter for receiving the second control signal.

For a still further embodiment, the invention provides a method of testing a memory device. The method includes applying a first potential to a first plurality of bitlines of the memory device and applying a second potential to a second plurality of bitlines of the memory device. Each bitline of the first plurality of bitlines is adjacent at least one bitline of the second plurality of bitlines. The method further includes measuring current leakage between a node applying the second potential and a node applying the first potential, and comparing the measured current leakage with a predetermined threshold current leakage value. The method still further includes identifying a short if the measured current leakage exceeds the predetermined threshold leakage value.

For another embodiment, the invention provides a method of testing a memory device. The method includes applying a voltage differential across alternate bitlines of the memory device and measuring current leakage across the voltage differential. The method further includes comparing the measured current leakage with a predetermined threshold current leakage value, and identifying a short if the measured current leakage exceeds the predetermined threshold leakage value. For yet another embodiment, the invention further provides for repeatedly applying the voltage differential and measuring current leakage at different levels of the memory device to locate the short.

The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate in the following description, previous process steps may have been utilized to form regions/junctions in the base semiconductor structure, and the term substrate includes the underlying layers containing such regions/junctions. The following detailed description is, therefore, not to be taken in a limiting sense, and the scope of the present invention is defined only by the appended claims and equivalents thereof.

Figure 1A:
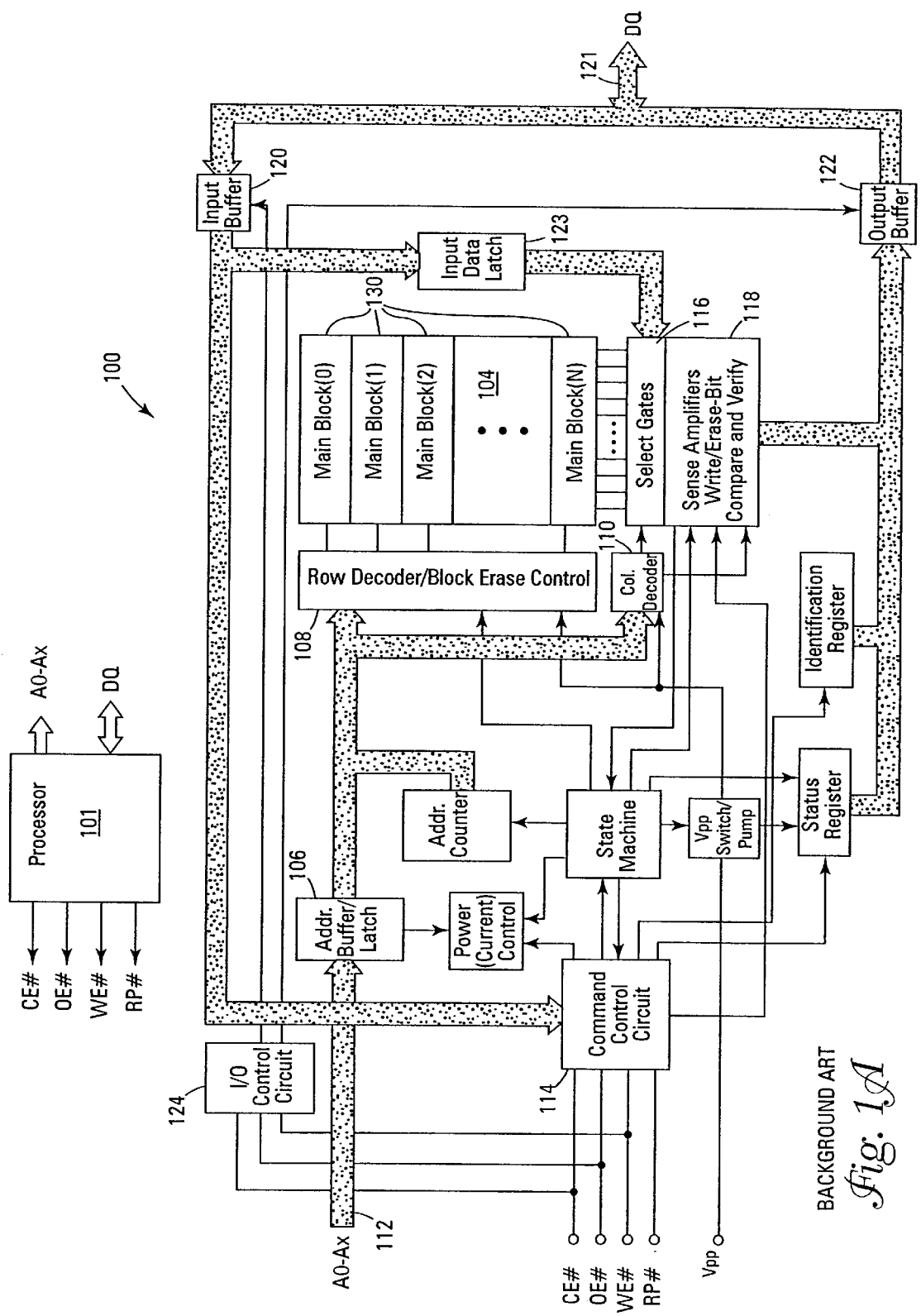
FIG. 1A is a block diagram of a basic flash memory device coupled to a processor.

FIG. 1A illustrates a block diagram of a basic flash memory device 100 which is coupled to a processor 101. The memory device 100 and the processor 101 may be part of an electronic system. The memory device 100 has been simplified to focus on features of the memory that are helpful in understanding the present invention. The memory device 100 includes an array of non-volatile memory cells 104. The memory cells are preferably floating gate memory cells. The array is arranged in rows and columns, with the rows arranged in blocks, such as main blocks 130. The structure of main blocks 130 allow memory cells to be erased in blocks. Data, however, is stored in the memory array separate from the block structure. A row decoder 108 and a column decoder 110 are provided to decode address signals provided on address lines A0–Ax 112. An address buffer circuit 106 is provided to latch the address signals. Address signals are received and decoded to access the memory array 104. A select circuit 116 is provided to select a column of the array identified with the column decoder 110. Sense amplifier and compare circuitry 118 is used to sense data stored in the memory cells and verify the accuracy of stored data. Data input 120 and output 122 buffer circuits are included for bidirectional data communication over a plurality of data (DQ) lines 121 with the processor 101. A data latch 123 is typically provided between input buffer 120 and the DQ lines 121 for storing data values (to be written to a memory cell) received from the DQ lines 121.

Command control circuit 114 decodes signals provided on control lines from the processor 101. These signals are used to control the operations on the memory array 104, including data read, data write, and erase operations. Input/output control circuit 124 is used to control the input buffer 120 and the output buffer 122 in response to some of the control signals. As stated above, the flash memory device 100 has been simplified to facilitate a basic understanding of the features of the memory. A more detailed understanding of flash memories is known to those skilled in the art.

Figure 1B:
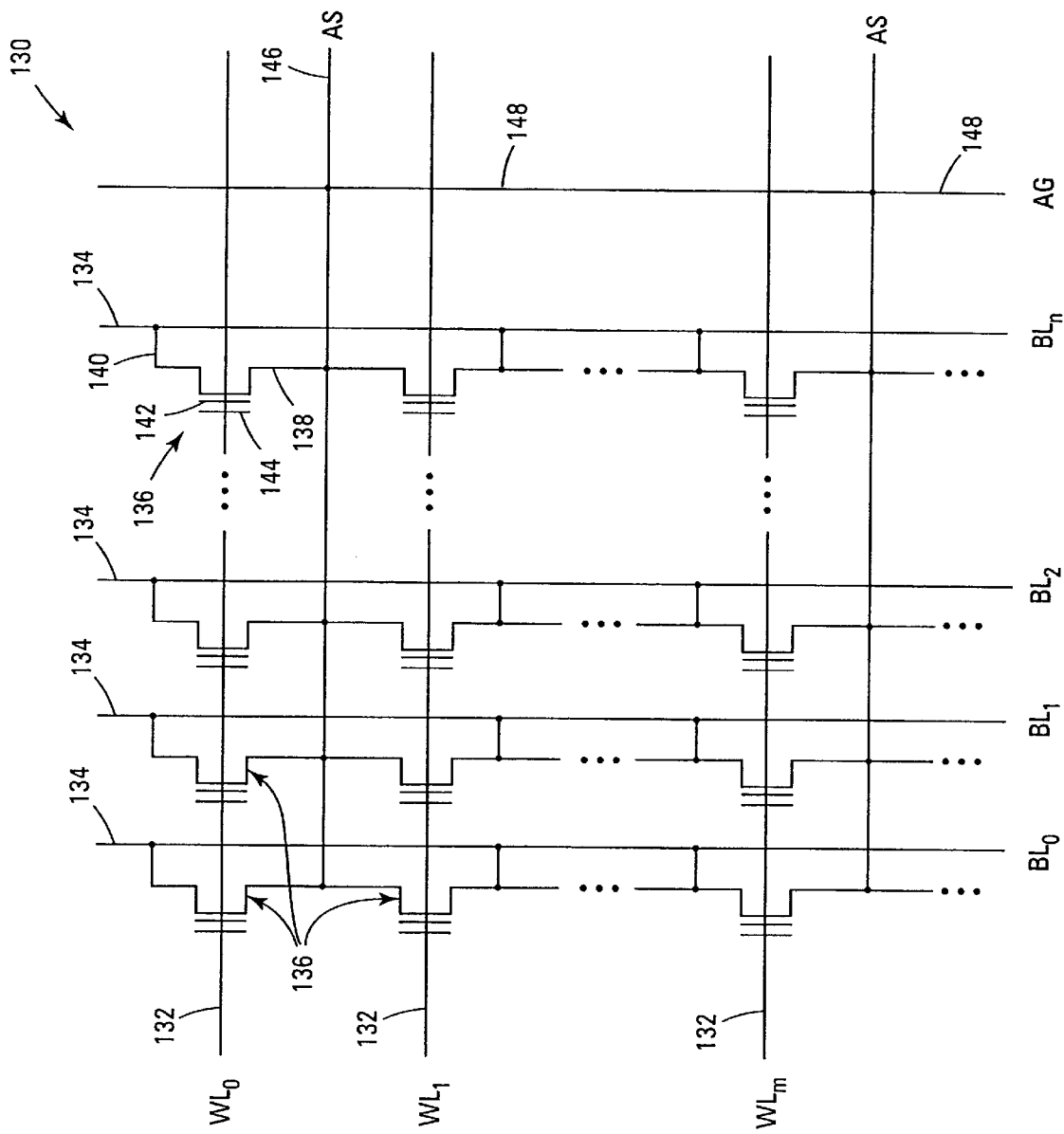
FIG. 1B is a schematic of a portion of a typical non-volatile memory main block as a portion of a memory array.

Arrays of non-volatile memory cells are often configured as floating gate transistors placed at the intersection of wordlines and bitlines. The wordlines are coupled to the control gates of the floating gate transistors. FIG. 1B is a schematic of a portion of a typical non-volatile memory main block 130 as a portion of a memory array.

The detail of main block 130 is provided to better understand the various embodiments of the invention. However, the invention is not limited to the specific floating-gate memory cell and layout described with reference to FIG. 1B.

As shown in FIG. 1B, the main block 130 includes wordlines 132 and intersecting bitlines 134. For ease of addressing in the digital environment, the number of wordlines 132 and the number of bitlines 134 are each some power of two, e.g., 256 wordlines 132 by 4,096 bitlines 134.

Floating gate transistors 136 are located at each intersection of a wordline 132 and a bitline 134. The floating gate transistors 136 represent the non-volatile memory cells for storage of data. Typical construction of such floating gate transistors 136 include a source 138 and a drain 140 constructed from an $N^+$-type material of high impurity concentration formed in a P-type semiconductor substrate of low impurity concentration, a channel region formed between the source and drain, a floating gate 142, and a control gate 144. Floating gate 142 is isolated from the channel region by a tunneling dielectric and from the control gate 144 by an intergate dielectric. The materials of construction are not critical to the invention, but commonly include doped polysilicon for the gate materials, and silicon oxides, nitrides or oxynitrides for the dielectric materials. Floating gate transistors 136 having their control gates 144 coupled to a wordline 132 typically share a common source 138 depicted as array source 146. As shown in FIG. 1B, floating gate transistors 136 coupled to two adjacent wordlines 132 may share the same array source 146. Floating gate transistors 136 have their drains 140 coupled to a bitline 134. A column of the floating gate transistors 136 are those transistors commonly coupled to a given bitline 134. A row of the floating gate transistors 136 are those transistors commonly coupled to a given wordline 132.

To reduce problems associated with high resistance levels in the array source 146, the array source 146 is regularly coupled to a metal or other highly conductive line to provide a low-resistance path to ground. The array ground 148 serves as this low-resistance path.

Prior to a read, or sense, operation, the bitlines 134 are generally pulled to a ground potential or discharged. This discharging permits the sensing circuitry (not shown in FIG. 1B) to sense and amplify smaller differentials than would otherwise be practical if the bitlines 134 were not brought to some reference potential prior to sensing. Field-effect transistors (FET) having first source/drain regions coupled to the bitlines 134 and second source/drain regions coupled to a ground potential have been used to pull the bitlines 134 to ground in response to a control signal. Such bitline discharging circuits have been described as in U.S. Pat. No. 5,862,077 issued Jan. 19, 1999 to Briner.

Figure 2:
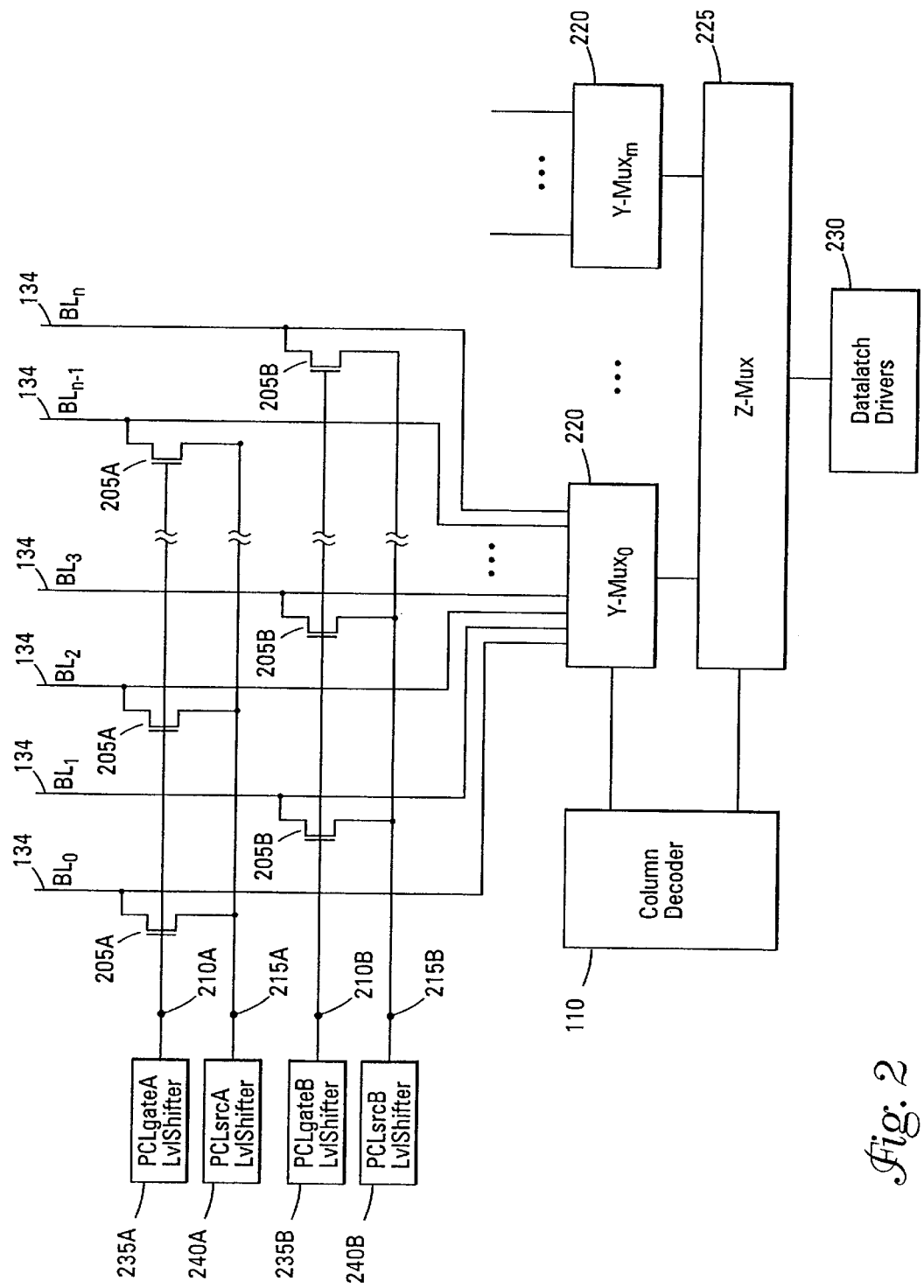
FIG. 2 is a schematic of a portion of a memory array having a bitline discharging circuit in accordance with one embodiment of the invention.
Figure 3A:
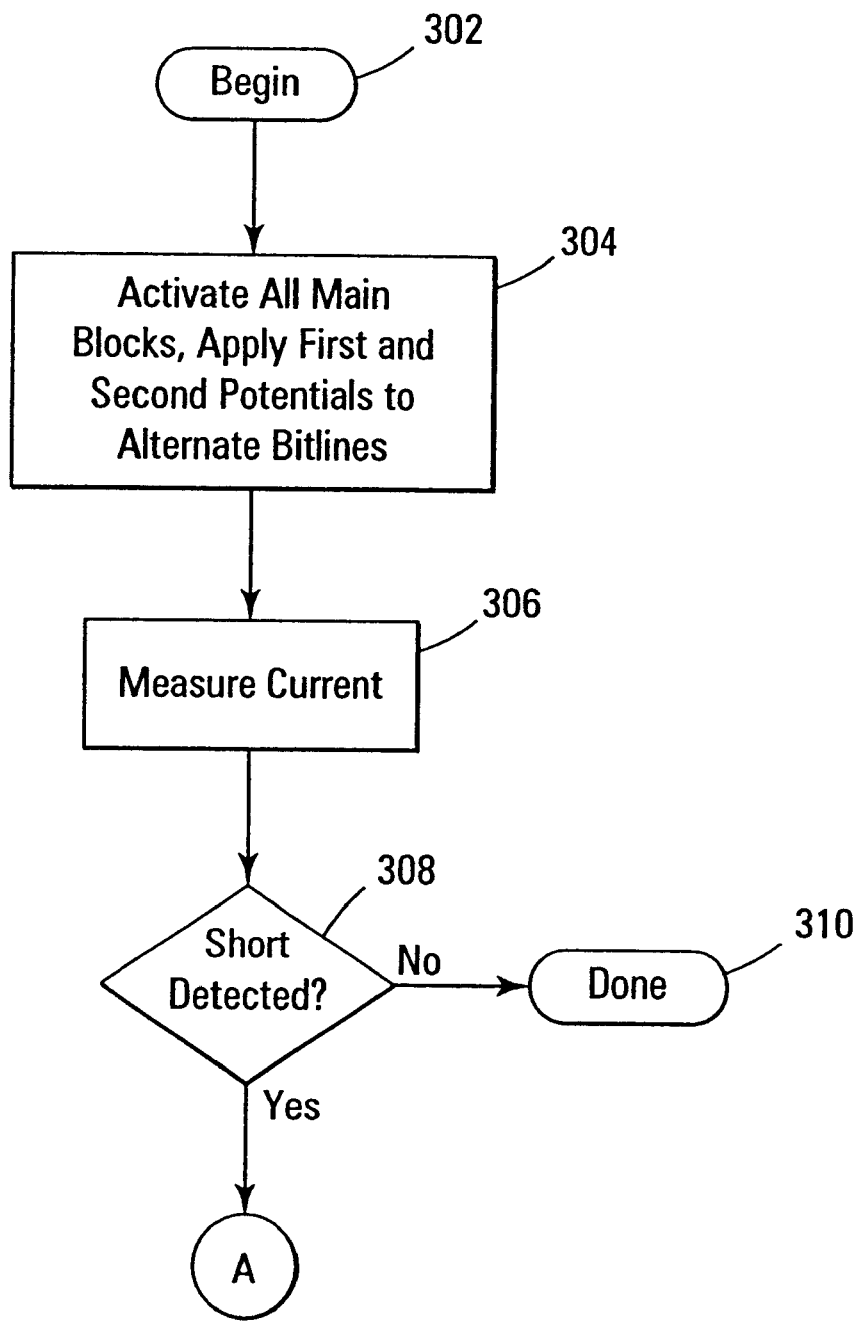
FIGS. 3A–3D are collectively a flowchart of a method of performing bitline stress testing in accordance with one embodiment of the invention.
Figure 3B:
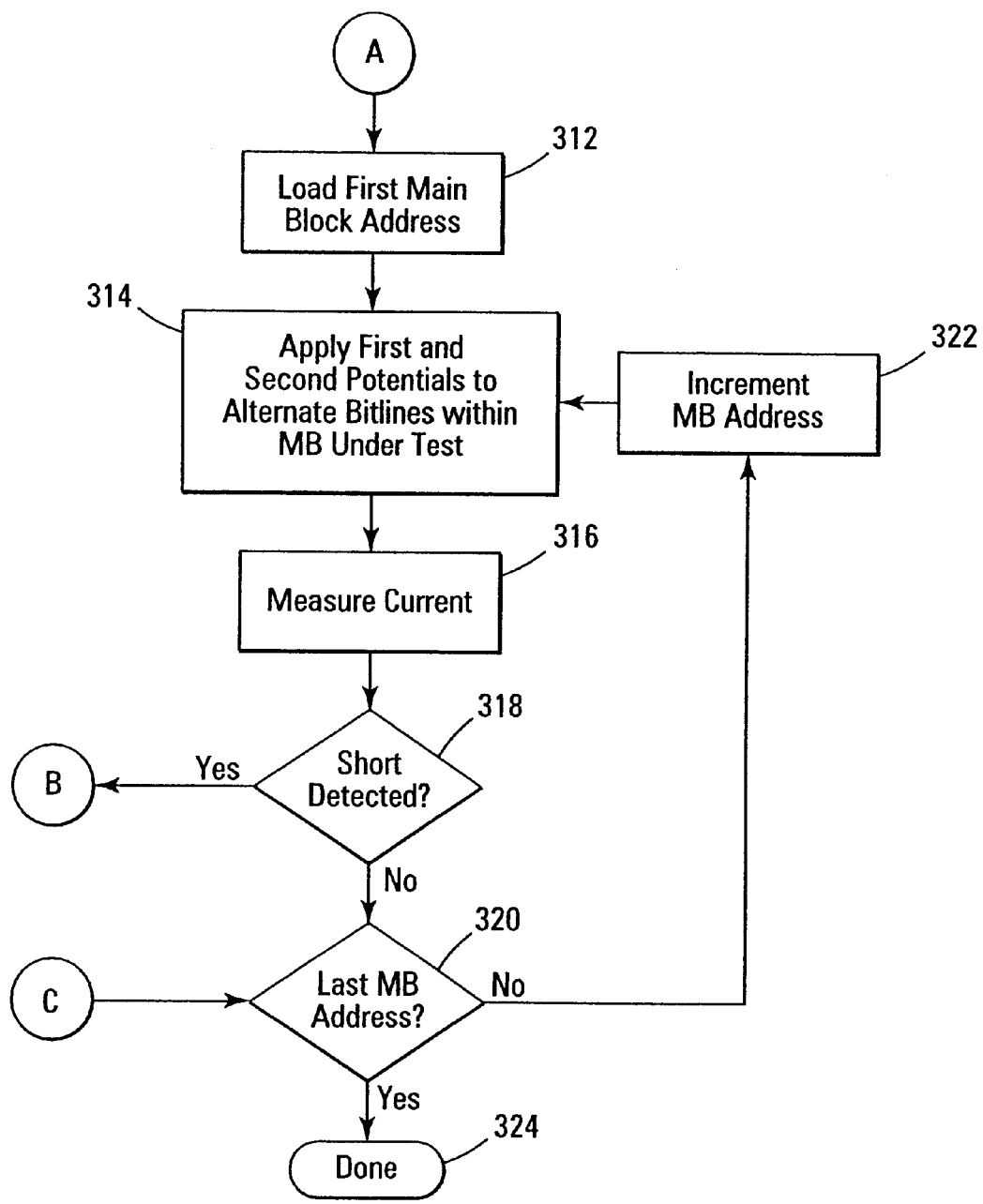
Figure 3C:
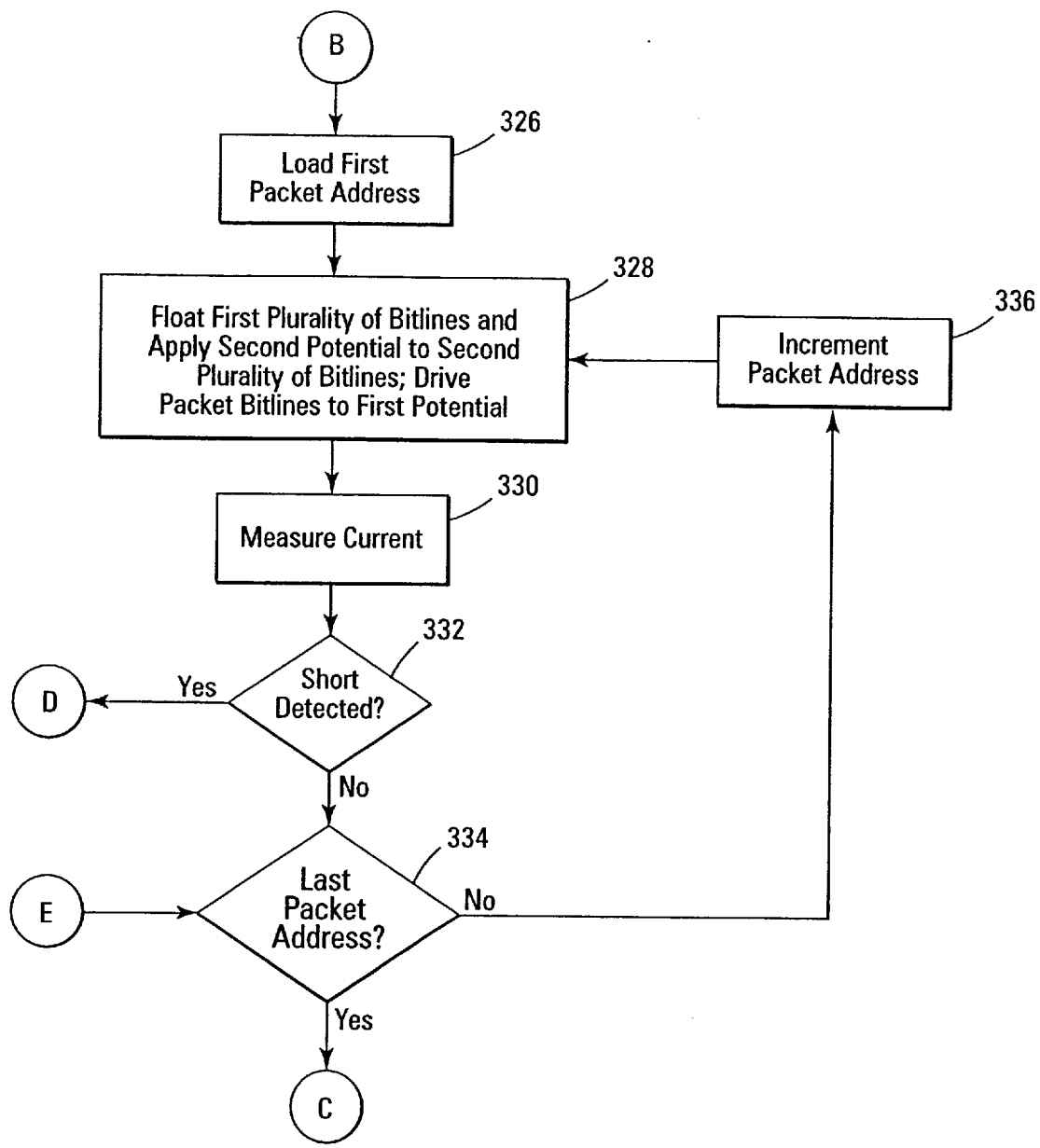
Figure 3D:
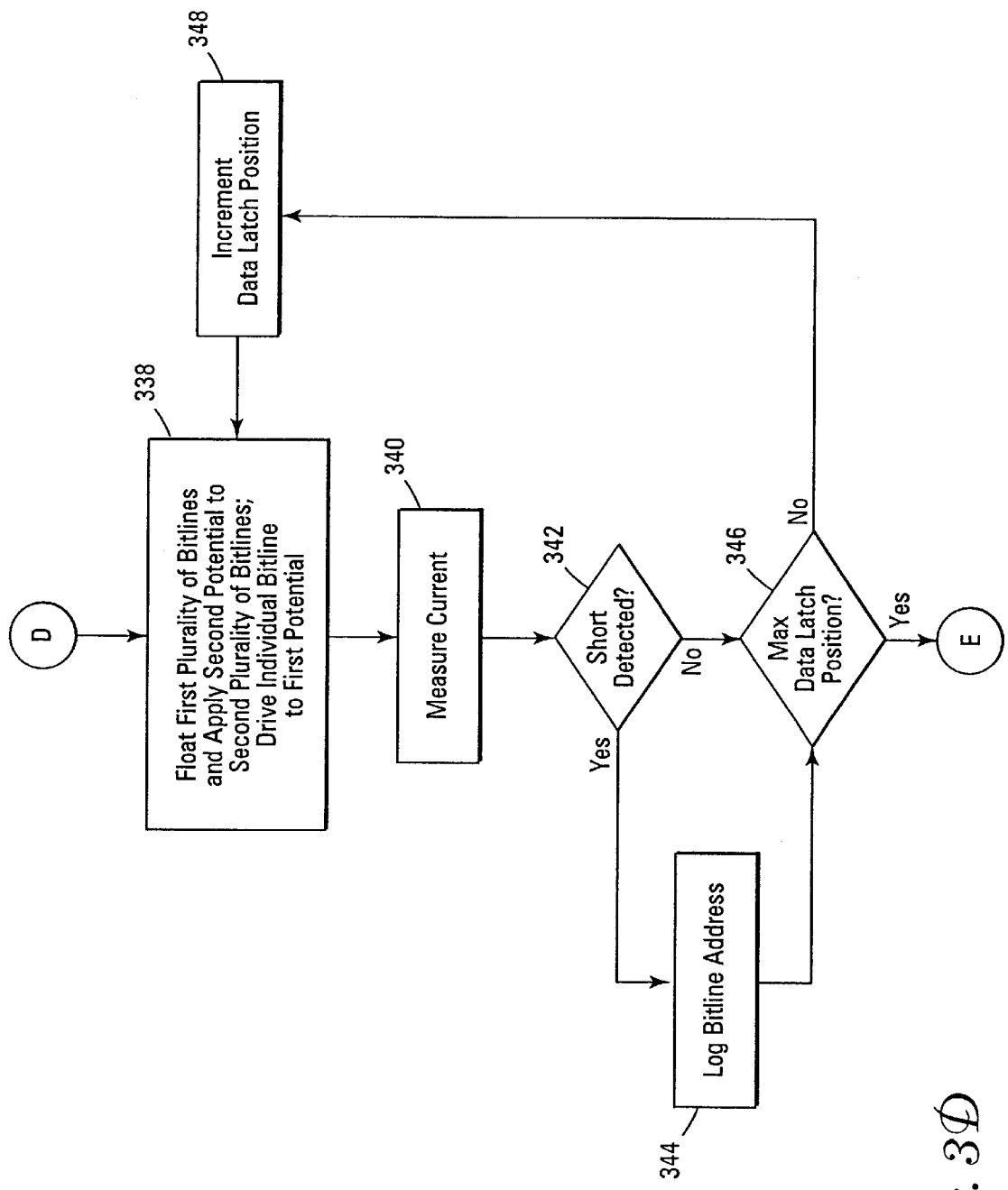

FIG. 2 is a schematic of a portion of a memory array having a bitline discharging circuit in accordance with the invention. The memory cells are not depicted in FIG. 2 for clarity.

As depicted in FIG. 2, each bitline 134 has a selective coupling device 205 coupled between it and a variable potential node 215. For one embodiment, the selective coupling device 205 is a field-effect transistor and the variable potential node 215 is a level shifter output. Other devices selectively providing for electrical communication between the bitline 134 and the variable potential node 215 in response to a control signal may be used as the selective coupling devices 205. Furthermore, other devices for providing multiple potential states may be used as the variable potential nodes 215. Selective coupling devices 205 can be used collectively to discharge all bitlines in other standard modes of operation, such as a read, or sense, operation.

A first plurality of selective coupling devices 205A each have a first source/drain region coupled to a bitline 134 of a first plurality of bitlines and a second source/drain region coupled to a first variable potential node 215A. A second plurality of selective coupling devices 205B each have a first source/drain region coupled to a bitline 134 of a second plurality of bitlines and a second source/drain region coupled to a second variable potential node 215B. The first plurality of bitlines and the second plurality of bitlines are mutually exclusive. Furthermore, the first and second pluralities of bitlines are staggered such that each bitline 134 within the first plurality of bitlines is adjacent at least one bitline 134 within the second plurality of bitlines. For one embodiment, the first plurality of selective coupling devices 205A and the second plurality of selective coupling devices 205B are coupled to alternate bitlines 134. As an example, the first plurality of bitlines 134 may be the even bitlines (BL0, BL2, BL4, . . . ) while the second plurality of bitlines 134 may be the odd bitlines (BL1, BL3, BL5, . . . ).

The first plurality of selective coupling devices 205A are responsive to a first control signal from a first control node 210A. The second plurality of selective coupling devices 205B are responsive to a second control signal from a second control node 210B. For one embodiment, control nodes 210A and 210B are coupled to level shifters 235A and 235B, respectively, to selectively receive the variable potential states. The level shifters 235 switch between three potential states for one embodiment. As an example, the control nodes 210 may selectively receive either a positive supply potential VCC or a ground potential during normal operation. The control nodes 210 may further selectively receive either a positive programming gate voltage VPX or the ground potential during bitline stress testing. The first and second selective coupling devices 205 are activated or deactivated in response to the first and second control signals, respectively. As an example, with the gates of field-effect transistors coupled to a control node 210, the field-effect transistors are responsive to the control signal from the control node 210 for activation and deactivation. While the control nodes 210 of this embodiment are capable of providing three potential states through the level shifters 235, the control nodes 210 merely need to provide at least two potential states capable of selectively activating or deactivating the selective coupling devices 205 during normal operation and during bitline testing of the memory device in accordance with the invention.

For one embodiment, the variable potential nodes 215A and 215B are coupled to level shifters 240A and 240B, respectively, for selectively receiving the variable potential states. The level shifters 240 switch between three potential states for one embodiment. The three potential states may include a first potential, a second potential and a high-impedance state. During normal operation, the variable potential nodes 215 may receive the second potential, such as a ground potential. Thus, in normal operation, the operation of the bitline discharging circuit is not interrupted. During bitline stress testing, the variable potential nodes 215 may selectively receive either the first potential (such as a test potential VBL), the second potential, or the high-impedance state. The test potential VBL may be an externally-applied voltage, such as from a test probe of a semiconductor device tester (not shown), provided through the level shifters 240. For one embodiment, the test potential VBL is a positive voltage potential. The first and second potentials must produce some voltage differential capable of inducing a measurable current flow between shorted bitlines. The polarities of the first and second potentials, however, are not crucial.

For another embodiment, the variable potential nodes 215A and 215B are coupled to level shifters 240A and 240B, respectively, for selectively receiving the variable potential states. The level shifters 240 for this embodiment switch between two potential states. The two potential states may include a first potential and a second potential. During normal operation, the variable potential nodes 215 may receive the second potential, such as a ground potential. Thus, in normal operation, the operation of the bitline discharging circuit is not interrupted. During bitline stress testing, the variable potential nodes 215 may selectively receive either the first potential (such as a test potential VBL) or the second potential. The test potential VBL may be an externally-applied voltage, such as from a test probe of a semiconductor device tester (not shown), provided through the level shifters 240.

The bitlines 134 are coupled to data latch drivers 230 through one or more multiplexers, such as Y-multiplexers 220 and Z-multiplexer 225. During a write, or programming, operation, the multiplexers 220 and 225 actively couple a bitline 134 to a data latch driver 230 in response to control signals from the column decoder 110. The data latch driver 230 selectively applies a ground potential or high potential to the actively coupled bitline 134 in response to the data value stored in the input data latch 123 (shown in FIG. 1A). For example, the data latch driver 230 may present a ground potential to a bitline 134 in response to a first data value, such as a 1, stored in the input data latch 123. Likewise, the data latch driver 230 may apply a high potential to the bitline 134 in response to a second data value, such as a 0, stored in the input data latch 123. The data latch driver 230 may be supplied by a level shifter or other variable potential source to provide a bitline programming voltage as the high potential during normal operation and to provide the test potential VBL as the high potential during bitline stress testing.

The input data latch 123 and the data latch drivers 230 may support simultaneous programming of a packet of memory cells on multiple bitlines 134 through the use of multiple data latch positions within the input data latch 123. As an example, the input data latch 123 and the data latch drivers 230 may store and drive, respectively, 256 individual data values across 256 lines. A packet address is a subdivision of a main block of memory cells, corresponding to a group of columns within the main block. While the group of columns within the packet may be contiguous, they also may be topologically scrambled. Each column within the packet may be topologically separated from other columns within the packet by some number of columns not contained within the packet.

The circuit depicted in FIG. 2 allows for the detection and location of bitline-to-bitline shorts by facilitating applying a first bitline potential to a first bitline and a second bitline potential to an adjacent bitline. The circuit allows for bitline stress testing at various levels, such as the device level, the main block level, the packet level and the bitline level. A main block is a subdivision of the memory device, a packet is a subdivision of a main block, and bitline is a subdivision of a packet. The main block, packet and bitline may be thought of as a first subdivision of the memory device, a second subdivision of the memory device, and a third subdivision of the memory device, respectively.

By allowing testing at these various levels, the time required to identify and locate a potential short may be reduced. The test potential VBL may be applied to every other bitline 134 within the memory array 104 (and, thus, the memory device 100), or to every other bitline 134 within a selected main block of the memory array 104 (and, thus, a selected main block of the memory device 100). Remaining bitlines 134, or some subset of remaining bitlines 134, may be brought to ground. This facilitates producing a voltage differential across predetermined sets of alternate bitlines 134. Excessive current leakage across this voltage differential, such as might be measured between the node supplying the test potential VBL and the node supplying the ground potential, is indicative of a short within the memory device 100. A method of performing the bitline stress testing in accordance with the invention is detailed in FIGS. 3A–3D.

FIGS. 3A–3D collectively provide a flowchart of a method of performing bitline stress testing in accordance with one embodiment of the invention. The test method begins at block 302. All main blocks of the memory device are activated at block 304. At this stage, first and second potentials are applied to first and second pluralities of the bitlines, such as alternate bitlines. For one embodiment, the first potential is the test potential VBL and the second potential is a ground potential. The first and second potentials may be applied to the entire memory device by concurrently activating all selective coupling devices 205 and bringing the first variable potential node 215A to the first potential and the second variable potential node 215B to the second potential. The selective coupling devices 205 may be activated by applying an appropriate control signal to their gates from control nodes 210. As an example, the programming gate voltage VPX applied to the gates of n-channel field effect transistors will activate the transistors while a ground potential applied to the same gates will deactivate the transistors. For one embodiment, this stage 304 is maintained for a predetermined period of time to exercise the stress of the material between the bitlines. The predetermined period of time may also be used to allow for capacitive effects, thus allowing the device to approach a steady state before measuring current leakage. For a further embodiment, the predetermined period of time is approximately 100 milliseconds.

The current between the potential node supplying the second potential and the potential node supplying the first potential is measured at block 306. If the current is above some predetermined threshold current leakage value, a short is detected at block 308 and processing continues at block 312. If the current is at or below the predetermined threshold, no short is detected at block 308 and processing is completed at block 310. The predetermined threshold is some base-level current leakage at the potential difference between the first and second potentials. Current levels above the predetermined threshold are indicative of unacceptable or undesirable current leakage within the memory device. While the predetermined threshold current leakage may generally be some nominal positive value, for one embodiment the predetermined threshold is zero detected current leakage.

Note that increasing levels of current leakage may be indicative of increasing numbers of shorts or increasing severity of shorts. While some level of shorting may be repaired out through the use of redundant devices or through deactivation of portions of the memory array, at some point the cost of repair may exceed the benefit. A second predetermined threshold may be defined that is indicative of a grossly defective part where repair is either unavailable or undesirable. If the current measured at block 306 is at or above the second predetermined threshold, the memory device may be designated as defective and processing may be terminated. If any level of shorting is unacceptable, the second predetermined threshold may be set at the same level as the first predetermined threshold.

If a short is detected at block 308 and continued testing is desired, a first main block address is loaded in block 312. At block 314, the first and second potentials are applied to first and second pluralities of the bitlines, such as alternate bitlines, within the main block under test. The first and second potentials may be applied to the bitlines within a main block by concurrently activating all selective coupling devices 205 within the main block and bringing the first variable potential node 215A to the first potential and the second variable potential node 215B to the second potential. The selective coupling devices 205 of other main blocks are deactivated during this stage.

The current between the potential node supplying the second potential and the potential node supplying the first potential is measured at block 316. If the current is above the predetermined threshold, a short is detected at block 318. If the current is at or below the predetermined threshold, no short is detected at block 308.

If no short is detected on the main block under test, the main block address is checked at block 320 to see if it is the last main block address within the memory device. If all main blocks have been individually tested, processing is completed at block 324. If one or more main blocks have not been individually tested, the main block address is incremented at block 322 and processing is continued at block 314.

If a short is detected on the main block under test, and further identification of the location of the short (or shorts) is not desired, the address of the main block under test can be logged and the processing can proceed from block 318 to block 320 regardless of detecting the short.

If a short is detected on the main block under test, and further identification of the location of the short (or shorts) is desired, a first packet address within the main block under test is loaded at block 326. At block 328, the first plurality of bitlines within the main block under test is electrically floated while the second plurality of bitlines within the main block under test is brought to the second potential. The first plurality of bitlines may be floated by deactivating the first plurality of selective coupling devices 205A; it is desirable to also bring the first variable potential node 215A to ground or floating at this time. Note that if the first variable potential node 215A is floating, there is no need to deactivate the first plurality of selective coupling devices 205A. The second plurality of bitlines may be brought to the second potential by activating the second plurality of selective coupling devices 205B and bringing the second variable potential node 215B to the second potential. All bitlines within the packet are then driven to the first potential. The bitlines within the packet may be driven to the first potential such as by loading the input data latch with all 0's and activating the data latch drivers with the high side of the data latch drivers supplied by the first potential. Note that the bitlines within the packet should all be within the first plurality of bitlines such that the data latch drivers are not driving bitlines actively coupled to the second potential. Accordingly, the first and second pluralities of bitlines for a first packet may correspond to second and first pluralities, respectively, for a second packet. Furthermore, the first and second potential nodes for the first packet may correspond to the second and first potential nodes, respectively, for the second packet.

The current between the potential node supplying the second potential and the potential node supplying the first potential is measured at block 330. If the current is above the predetermined threshold, a short is detected at block 332. If the current is at or below the predetermined threshold, no short is detected at block 332.

If no short is detected on the packet under test, the packet address is checked at block 334 to see if it is the last packet address within the main block under test. If all packets within the main block have been individually tested, processing is continued at block 320 to determine whether any main blocks remain to be tested. If one or more packets within the main block have not been individually tested, the packet address is incremented at block 336 and processing is continued at block 328.

If a short is detected on the packet under test, and further identification of the location of the short (or shorts) within the packet is not desired, the address of the packet under test can be logged and the processing can proceed from block 332 to block 334 regardless of detecting the short.

If a short is detected on the packet under test, and further identification of the location of the short (or shorts) within the packet is desired, processing is continued at block 338 to begin testing of the packet at the bitline level. At block 338, the first plurality of bitlines within the main block under test is electrically floated and the second plurality of bitlines within the main block under test is brought to the second potential. The first plurality of bitlines may be floated by deactivating the first plurality of selective coupling devices 205A; it is desirable to also bring the first variable potential node 215A to ground or floating at this time. Note that if the first variable potential node 215A is floating, there is no need to deactivate the first plurality of selective coupling devices 205A. The second plurality of bitlines may be brought to the second potential by activating the second plurality of selective coupling devices 205B and bringing the second variable potential node 215B to the second potential. One bitline within the packet is then driven to the first potential. An individual bitline within the packet may be driven to the first potential such as by loading one 0 in the input data latch (with all remaining data latch positions set as 1's) and activating the data latch drivers with the high side of the data latch drivers supplied by the first potential. Note that the bitlines within the packet should all be within the first plurality of bitlines such that the data latch drivers are not driving bitlines actively coupled to the second potential. Accordingly, the first and second pluralities of bitlines for a first packet may correspond to second and first pluralities, respectively, for a second packet. Furthermore, the first and second potential nodes for the first packet may correspond to the second and first potential nodes, respectively, for the second packet.

The current between the potential node supplying the second potential and the potential node supplying the first potential is measured at block 340. If the current is above the predetermined threshold, a short is detected at block 342 and the bitline address corresponding to the input data latch position containing the data value of 0 is logged at block 344. Processing then continues at block 346 to determine whether any bitlines remain to be tested within the packet under test. If the current is at or below the predetermined threshold, no short is detected at block 332 and processing is continued at block 346. Note that although a short detected at block 342 is indicative of a short between the tested bitline and an adjacent bitline, it does not identify to which of its two adjacent bitlines it is shorted. By repeating this procedure (blocks 338 through 344) for at least one of the adjacent bitlines, the logged bitline addresses can be compared to identify which two bitlines are shorted. During such a repetition, the bitline corresponding to the first logged bitline address will be a member of the second plurality of bitlines, and thus driven to the second potential, while the adjacent bitline under test will be a member of the first plurality of bitlines and driven to the first potential.

At block 346, the input data latch position is checked to see if it is the last position within the packet under test. When loading a 0 into one position within the input data latch at block 338, the input data latch position is the last position when the current has been measured at block 340 with the data value of 0 in each position of the input data latch. When all data latch positions within the packet have been individually tested, processing is returned to block 334. If one or more positions within the packet have not been individually tested, the position is incremented, i.e., the 0 is moved to the next input data latch position, at block 348. Processing is then continued at block 338.

While the foregoing embodiment provides for testing of individual packets and bitlines within a main block prior to proceeding to the next main block, the methods could proceed in a different order. As an example, a method may first test the memory device at the device level (see, generally, FIG. 3A), then test each main block (see, generally, FIG. 3B), then test each packet (see, generally, FIG. 3C) for each main block in which a short was identified, and then test each bitline (see, generally, FIG. 3D) for each packet in which a short was identified. Furthermore, incrementing addresses need not proceed in direct numerical order. As an example, testing of packets within a main block may first test all packets having bitlines associated with the first variable potential node 215A and then test all packets having bitlines associated with the second variable potential node 215B. In addition, one or more testing levels may be eliminated. As one example, a method may first test the memory device at the device level. If a short is detected, the method may then test each bitline for each packet, without first testing at the main block level or packet level.

CONCLUSION

Memory device architectures and methods of testing memory devices are described for the identification and location of shorts within the memory device. The memory devices include a first plurality of selective coupling devices coupled between a first plurality of bitlines and a first variable potential node. The memory devices further include a second plurality of selective coupling devices coupled between a second plurality of bitlines and a second variable potential node. The first plurality of selective coupling devices are responsive to a first control signal to selectively provide electrical communication between the first plurality of bitlines and the first variable potential node. The second plurality of selective coupling devices are responsive to a second control signal to selectively provide electrical communication between the second plurality of bitlines and the second variable potential node. The foregoing architecture permits applying a voltage differential across alternate bitlines within the memory device.

Methods of testing the memory devices in accordance with the invention include applying a voltage differential across alternate bitlines, measuring the current leakage induced by the voltage differential, and comparing the current leakage to a predetermined threshold leakage value. Repetition of this procedure at various levels, such as the device level, block level, packet level or bitline level, can be used to not only identify the existence of a short, but to also locate the short with desired specificity.

The data values of 1 and 0 were referenced in the example embodiments as the first and second data values for the input data latch, respectively. These values were chosen to match the data latch drivers of the example embodiment, i.e., a data value of 1 causing the data latch driver to present a ground potential and a data value of 0 causing the data latch driver to present a high potential. However, the action of these data values on the data latch drivers overrides the chosen data value assigned to the first or second data value. Accordingly, other data values may represent the first and second data values provided the appropriate response is attained from the data latch drivers as detailed in the foregoing discussion.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. As an example, other potentials can be used provided the current leakage is measured across some voltage differential. As a further example, the second potential could be the high potential. Accordingly, this application is intended to cover any adaptations or variations of the invention. It is manifestly intended that this invention be limited only by the following claims and equivalents thereof.

What is claimed is:

1. A memory array, comprising:
   a plurality of memory cells coupled to a first plurality of bitlines and a second plurality of bitlines;
   a first plurality of selective coupling devices coupled between the first plurality of bitlines and a first variable potential node; and
   a second plurality of selective coupling devices coupled between the second plurality of bitlines and a second variable potential node;
   wherein each bitline of the first plurality of bitlines is adjacent at least one bitline of the second plurality of bitlines;
   wherein the first variable potential node is coupled to selectively receive one of at least three potential states including a first potential, a second potential and a high-impedance state; and
   wherein the second variable potential node is coupled to selectively receive one of at least three potential states including the first potential, the second potential and the high-impedance state.

2. The memory array of claim 1, wherein the memory array is a flash memory array and the plurality of memory cells further comprises a plurality of non-volatile flash memory cells.

3. The memory array of claim 1, wherein the first potential is a positive voltage potential and the second potential is a ground potential.

4. A memory array, comprising:
   a plurality of memory cells coupled to a first plurality of bitlines and a second plurality of bitlines;
   a first plurality of selective coupling devices coupled between the first plurality of bitlines and a first variable potential node; and
   a second plurality of selective coupling devices coupled between the second plurality of bitlines and a second variable potential node;
   wherein each bitline of the first plurality of bitlines is adjacent at least one bitline of the second plurality of bitlines; and
   wherein the first and second variable potential nodes are each further coupled to a level shifter for selectively receiving at least two potential states.

5. A memory array, comprising:
   a plurality of memory cells coupled to a first plurality of bitlines and a second plurality of bitlines;
   a first plurality of selective coupling devices coupled between the first plurality of bitlines and a first variable potential node; and a second plurality of selective coupling devices coupled between the second plurality of bitlines and a second variable potential node;

wherein each bitline of the first plurality of bitlines is adjacent at least one bitline of the second plurality of bitlines; and wherein the first and second variable potential nodes are each further coupled to a level shifter for selectively receiving either a first potential or a second potential.

6. The memory array of claim 5, wherein the first potential is a positive voltage potential and the second potential is a ground potential.

7. A memory array, comprising:

a plurality of memory cells coupled to a first plurality of bitlines and a second plurality of bitlines;

a first plurality of selective coupling devices coupled between the first plurality of bitlines and a first variable potential node; and a second plurality of selective coupling devices coupled between the second plurality of bitlines and a second variable potential node;

wherein each bitline of the first plurality of bitlines is adjacent at least one bitline of the second plurality of bitlines; and wherein the first and second variable potential nodes are each further coupled to a level shifter for selectively receiving either a first potential, a second potential, or a high-impedance state.

8. A memory array, comprising:

a plurality of memory cells coupled to a first plurality of bitlines and a second plurality of bitlines;

a first plurality of selective coupling devices coupled between the first plurality of bitlines and a first level shifter for selectively providing at least a first potential and a second potential to the first plurality of bitlines; and a second plurality of selective coupling devices coupled between the second plurality of bitlines and a second level shifter for selectively providing at least the first potential and the second potential to the second plurality of bitlines.

9. The memory array of claim 8, wherein the memory array is a flash memory array and the plurality of memory cells further comprises a plurality of non-volatile flash memory cells.

10. A flash memory array, comprising:

a plurality of non-volatile flash memory cells coupled to a first plurality of bitlines and a second plurality of bitlines; and a bitline discharging circuit coupled to the first plurality of bitlines and the second plurality of bitlines, wherein the bitline discharging circuit comprises:

a first plurality of selective coupling devices coupled between the first plurality of bitlines and a first variable potential node; and a second plurality of selective coupling devices coupled between the second plurality of bitlines and a second variable potential node;

wherein the first and second variable potential nodes are each coupled to selectively receive one of at least three potential states including a first potential, a second potential lower than the first potential, and a high-impedance state.

11. A flash memory array, comprising:

a plurality of non-volatile flash memory cells coupled to a plurality of even bitlines and a plurality of odd bitlines; and a bitline discharging circuit coupled to the plurality of even bitlines and the plurality of odd bitlines, wherein the bitline discharging circuit comprises:

a first plurality of selective coupling devices coupled between the plurality of even bitlines and a first variable potential node; and a second plurality of selective coupling devices coupled between the plurality of odd bitlines and a second variable potential node;

wherein the first and second variable potential nodes are each coupled to selectively receive one of at least three potential states including a positive voltage potential, a ground potential and a high-impedance state.

12. A flash memory array, comprising:

a plurality of non-volatile flash memory cells coupled to a plurality of even bitlines and a plurality of odd bitlines;

a first plurality of field-effect transistors each having a first source/drain region coupled to one of the plurality of even bitlines and a second source/drain region coupled to a first variable potential node; and a second plurality of field-effect transistors each having a first source/drain region coupled to one of the plurality of odd bitlines and a second source/drain region coupled to a second variable potential node;

wherein the first and second variable potential nodes are each coupled to selectively receive either a first potential, a second potential lower than the first potential, or a high-impedance state.

13. A flash memory array, comprising:

a plurality of non-volatile flash memory cells coupled to a first plurality of bitlines and a second plurality of bitlines;

a first plurality of field-effect transistors each having a first source/drain region coupled to one of the first plurality of bitlines and a second source/drain region coupled to a first variable potential node; and a second plurality of field-effect transistors each having a first source/drain region coupled to one of the second plurality of bitlines and a second source/drain region coupled to a second variable potential node;

wherein each bitline of the first plurality of bitlines is adjacent at least one bitline of the second plurality of bitlines;

wherein the first variable potential node is coupled to selectively receive either a first potential, a second potential lower than the first potential, or a high-impedance state; and wherein the second variable potential node is coupled to selectively receive either the first potential, the second potential or the high-impedance state.

14. A flash memory array, comprising:

a plurality of non-volatile flash memory cells coupled to a first plurality of bitlines and a second plurality of bitlines;

a first plurality of field-effect transistors each having a first source/drain region coupled to one of the first plurality of bitlines, a second source/drain region coupled to a first variable potential node, and a gate coupled to a first control node; and a second plurality of field-effect transistors each having a first source/drain region coupled to one of the second plurality of bitlines, a second source/drain region coupled to a second variable potential node, and a gate coupled to a second control node;

wherein each bitline of the first plurality of bitlines is adjacent at least one bitline of the second plurality of bitlines; and wherein the first and second variable potential nodes are each coupled to selectively receive one of at least three potential states including a positive voltage potential, a ground potential and a high-impedance state.

15. A flash memory array, comprising:

a plurality of non-volatile flash memory cells coupled to a plurality of even bitlines and a plurality of odd bitlines;

a first level shifter for providing one of at least two first potential states as a first bitline potential;

a second level shifter for providing one of the at least two first potential states as a second bitline potential;

a third level shifter for providing one of at least two second potential states as a first control signal;

a fourth level shifter for providing one of the at least two second potential states as a second control signal;

a first plurality of field-effect transistors each having a first source/drain region coupled to one of the plurality of even bitlines, a second source/drain region coupled to the first level shifter for receiving the first bitline potential, and a gate coupled to the third level shifter for receiving the first control signal; and a second plurality of field-effect transistors each having a first source/drain region coupled to one of the plurality of odd bitlines, a second source/drain region coupled to the second level shifter for receiving the second bitline potential, and a gate coupled to the fourth level shifter for receiving the second control signal.

16. A flash memory array, comprising:

a plurality of non-volatile flash memory cells coupled to a plurality of even bitlines and a plurality of odd bitlines;

a first level shifter for providing either a ground potential, a test potential or a high-impedance state as a first bitline potential;

a second level shifter for providing either the ground potential, the test potential or the high-impedance state as a second bitline potential;

a third level shifter for providing either the ground potential or a positive programming voltage as a first control signal;

a fourth level shifter for providing either the ground potential or the positive programming voltage as a second control signal;

a first plurality of n-channel field-effect transistors each having a first source/drain region coupled to one of the plurality of even bitlines, a second source/drain region coupled to the first level shifter for receiving the first bitline potential, and a gate coupled to the third level shifter for receiving the first control signal; and a second plurality of n-channel field-effect transistors each having a first source/drain region coupled to one of the plurality of odd bitlines, a second source/drain region coupled to the second level shifter for receiving the second bitline potential, and a gate coupled to the fourth level shifter for receiving the second control signal.

17. An electronic system, comprising:

a processor; and a memory array coupled to the processor, wherein the memory array comprises:

a plurality of memory cells coupled to a first plurality of bitlines and a second plurality of bitlines;

a first plurality of selective coupling devices coupled between the first plurality of bitlines and a first variable potential node; and a second plurality of selective coupling devices coupled between the second plurality of bitlines and a second variable potential node;

wherein each bitline of the first plurality of bitlines is adjacent at least one bitline of the second plurality of bitlines;

wherein the first variable potential node is coupled to selectively receive one of at least three potential states including a first potential, a second potential and a high-impedance state; and wherein the second variable potential node is coupled to selectively receive one of at least three potential states including the first potential, the second potential and the high-impedance state.

18. An electronic system, comprising:

a processor; and a memory array coupled to the processor, wherein the memory array comprises:

a plurality of memory cells coupled to a first plurality of bitlines and a second plurality of bitlines;

a first plurality of selective coupling devices coupled between the first plurality of bitlines and a first level shifter for selectively providing at least a first potential and a second potential to the first plurality of bitlines; and a second plurality of selective coupling devices coupled between the second plurality of bitlines and a second level shifter for selectively providing at least the first potential and the second potential to the second plurality of bitlines.

19. An electronic system, comprising:

a processor; and a memory array coupled to the processor, wherein the memory array comprises:

a plurality of memory cells coupled to a first plurality of bitlines and a second plurality of bitlines; and a bitline discharging circuit coupled to the first plurality of bitlines and the second plurality of bitlines, wherein the bitline discharging circuit comprises:

a first plurality of selective coupling devices coupled between the first plurality of bitlines and a first variable potential node; and a second plurality of selective coupling devices coupled between the second plurality of bitlines and a second variable potential node;

wherein each variable potential node is coupled to selectively receive one of at least three potential states including a first potential, a second potential lower than the first potential, and a high-impedance state.

20. An electronic system, comprising:

a processor; and a memory array coupled to the processor, wherein the memory array comprises:

a plurality of memory cells coupled to a plurality of even bitlines and a plurality of odd bitlines;

a first plurality of field-effect transistors each having a first source/drain region coupled to one of the plurality of even bitlines and a second source/drain region coupled to a first variable potential node; and a second plurality of field-effect transistors each having a first source/drain region coupled to one of the plurality of odd bitlines and a second source/drain region coupled to a second variable potential node;

wherein each variable potential node is coupled to selectively receive either a first potential, a second potential or a high-impedance state.

21. An electronic system, comprising:

a processor; and a memory array coupled to the processor, wherein the memory array comprises:

a plurality of memory cells coupled to a plurality of even bitlines and a plurality of odd bitlines;

a first level shifter for providing one of at least two first potential states as a first bitline potential;

a second level shifter for providing one of the at least two first potential states as a second bitline potential;

a third level shifter for providing one of at least two second potential states as a first control signal;

a fourth level shifter for providing one of the at least two second potential states as a second control signal;

a first plurality of field-effect transistors each having a first source/drain region coupled to one of the plurality of even bitlines, a second source/drain region coupled to the first level shifter for receiving the first bitline potential, and a gate coupled to the third level shifter for receiving the first control signal; and a second plurality of field-effect transistors each having a first source/drain region coupled to one of the plurality of odd bitlines, a second source/drain region coupled to the second level shifter for receiving the second bitline potential, and a gate coupled to the fourth level shifter for receiving the second control signal.

* * * * *